United States Patent
Raj et al.

(10) Patent No.: US 8,928,334 B1
(45) Date of Patent: Jan. 6, 2015

(54) ON-CHIP NOISE MEASUREMENT

(71) Applicant: Xilinx, Inc., San Jose, CA (US)

(72) Inventors: Mayank Raj, Pasadena, CA (US);
Didem Z. Turker Melek, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 230 days.

(21) Appl. No.: 13/722,800

(22) Filed: Dec. 20, 2012

(51) Int. Cl.
*G01R 29/26* (2006.01)

(52) U.S. Cl.
CPC ..................... *G01R 29/26* (2013.01)
USPC ........................ 324/613; 324/614

(58) Field of Classification Search
CPC ........................................ G01R 29/26
USPC ................................... 324/613, 614
See application file for complete search history.

(56) References Cited

U.S. PATENT DOCUMENTS

| | | | |
|---|---|---|---|
| 7,116,114 B2 * | 10/2006 | Kajita | 324/613 |
| 7,933,726 B2 * | 4/2011 | Hamre et al. | 702/69 |
| 2013/0221987 A1 * | 8/2013 | Cranford et al. | 324/613 |

OTHER PUBLICATIONS

Alon, Elad et al., "Circuits and Techniques for High-Resolution Measurement of On-Chip Power Supply Noise," *IEEE Journal of Solid-State Circuits*, Apr. 2005, pp. 820-828, vol. 32, No. 2, IEEE, Piscataway, New Jersey, USA.

Alon, Elad et al., "On-Die Power Supply Noise Measurement Techniques," *IEEE Transactions on Advanced Packaging*, May 2009, pp. 248-259, vol. 32, No. 2, IEEE, Piscataway, New Jersey, USA.

Takamiya, Makato et al., "An On-chip 100GHz-Sampling Rate 8-channel Sampling Oscilloscope with Embedded Sampling Clock Generator," *2002 IEEE Solid-State Circuits Conference Technical Digest*, Feb. 2002, 3 pages, vol. 1.

\* cited by examiner

*Primary Examiner* — Jeff Natalini
(74) *Attorney, Agent, or Firm* — W. Eric Webostad

(57) ABSTRACT

An apparatus relating to on-chip noise measurement is disclosed. In such an apparatus, an asynchronous comparator receives a first input and a second input to provide a digital output. A threshold voltage generator receives a first periodic signal and a second periodic signal to provide the second input as an analog voltage responsive to the first and second periodic signals. A sampling circuit is coupled to receive the digital output signal and a third periodic signal. The sampling circuit is configured to sample the digital output signal using the third periodic signal to provide a sampled signal of the digital output signal. A processor is coupled to receive a delay signal and the sampled signal to determine a noise measurement signal for the first input signal.

20 Claims, 6 Drawing Sheets

ON-CHIP NOISE MEASUREMENT

TECHNICAL FIELD

An embodiment relates to integrated circuit devices ("ICs"). More particularly, an embodiment relates to on-chip noise measurement for an IC.

BACKGROUND

Integrated circuits have become more "dense" over time, i.e., more logic features have been implemented in an IC of a given size. Furthermore, signal swings have been reduced and frequencies of operation have increased. Accordingly, noise may play a more prominent role in causing problems in operation of an IC. Along those lines, debugging problems of a chip may involve a greater understanding of on-chip noise. Others have suggested using sub-sampling to measure on-chip noise, and while simple, sub-sampling is used for measuring periodic noise; however, not all noise is periodic noise. Others have suggested using autocorrelation to measure random noise; however, these approaches are complex and involve a substantial amount of routing overhead.

Accordingly, it would be desirable and useful to provide on-chip noise measurement capable of measuring random noise with less overhead than conventional autocorrelation on-chip noise measurement circuits.

SUMMARY

An apparatus relates generally to on-chip noise measurement. In such an apparatus, an asynchronous comparator is coupled to receive a first input signal and a second input signal to provide a digital output signal, where the digital output signal includes frequency information for noise on the first input signal. A threshold voltage generator is coupled to receive a first periodic signal and a second periodic signal, where the threshold voltage generator is configured to provide the second input signal as an analog voltage responsive to the first periodic signal. A sampling circuit is coupled to receive the digital output signal, a third periodic signal, and a fourth periodic signal. The fourth periodic signal is related to the third periodic signal. The sampling circuit is configured to sample the digital output signal using the third periodic signal to provide a first sampling of the digital output signal and configured to sample the digital output signal using the fourth periodic signal to provide a second sampling of the digital output signal. A processor is coupled to receive a delay signal, the first sampling and the second sampling to determine a noise measurement signal for the first input signal.

Another apparatus relates generally to on-chip noise measurement. In such an apparatus, an asynchronous comparator is coupled to receive a first input signal and a second input signal to provide a digital output signal. The digital output signal includes frequency information for noise on the first input signal. A threshold voltage generator is coupled to receive a first periodic signal and a second periodic signal. The threshold voltage generator is configured to provide the second input signal as an analog voltage responsive to the first periodic signal and the second periodic signal. A sampling circuit is coupled to receive the digital output signal and a third periodic signal. The sampling circuit is configured to sample the digital output signal using the third periodic signal to provide a sampled signal of the digital output signal. A processor is coupled to receive a delay signal and the sampled signal to determine a noise measurement signal for the first input signal.

A method relates generally to on-chip noise measurement. In such an embodiment, a first input signal and a second input signal are asynchronously compared using an asynchronous comparator to provide a first digital output signal. The first digital output signal includes frequency information for noise on the first input signal. A sequence of pulses is generated responsive to a first periodic signal to provide a second digital output signal. With a digital-to-analog converter ("DAC") coupled to receive a second periodic signal, the second digital output signal is converted to provide the second input signal as an analog voltage. The first digital output signal is sampled using a third periodic signal to provide a first sampling of the first digital output signal. The first digital output signal is sampled using a fourth periodic signal related to the third periodic signal to provide a second sampling of the first digital output signal. A noise measurement signal for the first input signal is determined responsive to a delay signal, the first sampling, and the second sampling.

BRIEF DESCRIPTION OF THE DRAWINGS

Accompanying drawings show exemplary embodiments. However, the accompanying drawings should not be taken to limit the embodiments shown, but are for explanation and understanding only.

DETAILED DESCRIPTION

Figure 1:
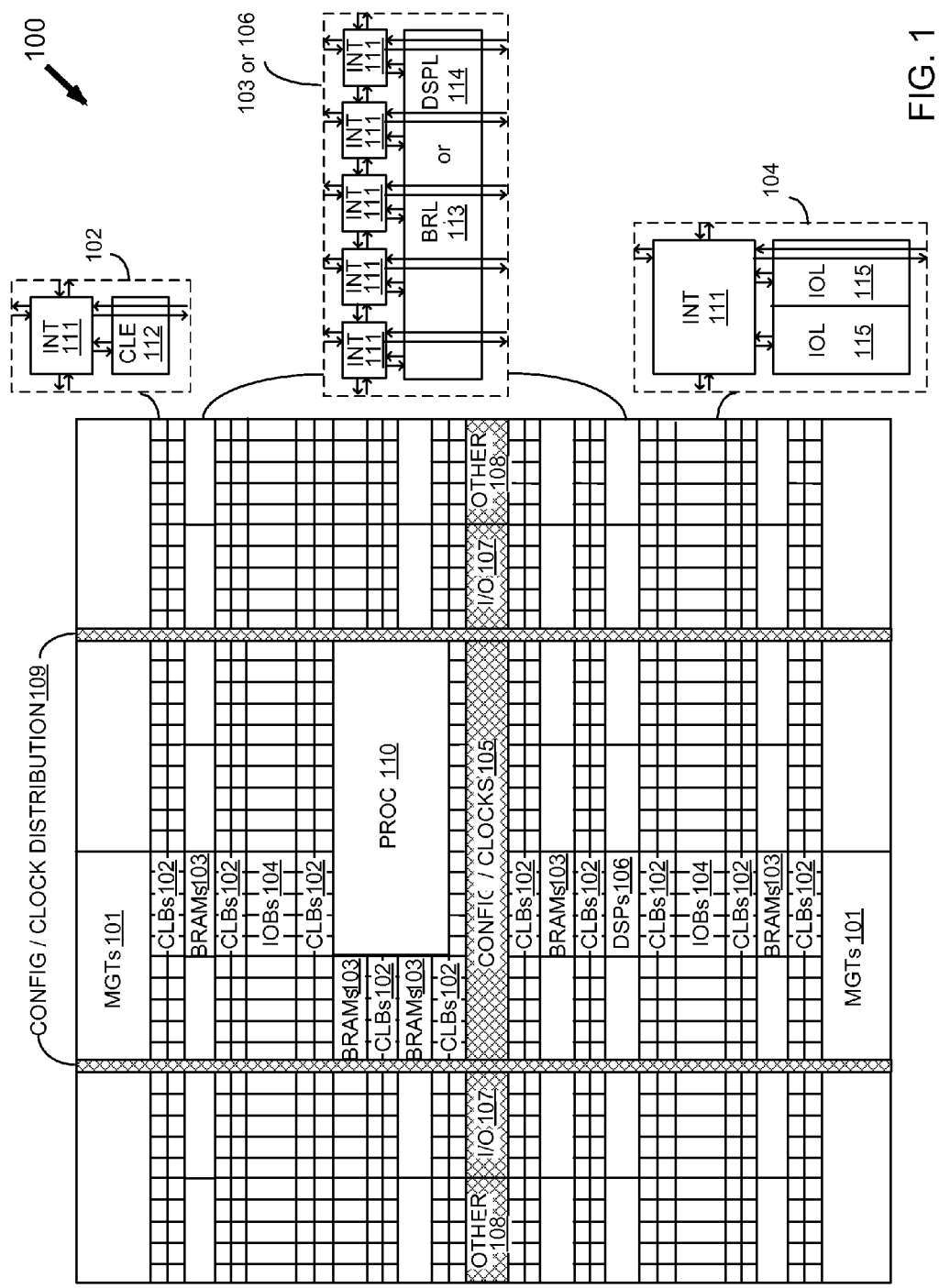
FIG. 1 is a simplified block diagram depicting an exemplary embodiment of a columnar Field Programmable Gate Array ("FPGA") architecture.

In the following description, numerous specific details are set forth to provide a more thorough description of the specific examples. It should be apparent, however, to one skilled in the art, that the exemplary apparatus and methods may be practiced without all the specific details given below. In other instances, well known features have not been described in detail so as not to obscure the examples. For ease of illustration, the same number labels are used in different diagrams to refer to the same items; however, in alternative embodiments the items may be different.

Before describing exemplary apparatus and methods illustratively depicted in the several figures, a general introduction is provided to further understanding.

The below-described noise measurement system includes local comparison units or sensors ("local units"), which may include asynchronous comparators for example, placed near target signals and a common set of global processing circuitry. The local units collect data from local signals of interest and feed such data to the global processing circuitry. The global processing circuit may be used to determine various values, including without limitation autocorrelation of noise samples. The local units may respectively be clock-less analog comparators, which convert analog noise on a target signal into a digital signal, where such digital signal is easier to process and transfer from various local measurement points than a corresponding analog signal. By avoiding clocked comparators, which involve complex clock routing, and by using only a single comparator in a local unit, a low-cost solution to on-chip noise measurement is provided.

With the above general understanding borne in mind, various examples of a noise measurement system are generally described below.

Because one or more of the above-described examples may be exemplified using a particular type of IC, a detailed description of such an IC is provided below. However, it should be understood that other types of ICs may benefit from the following description.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
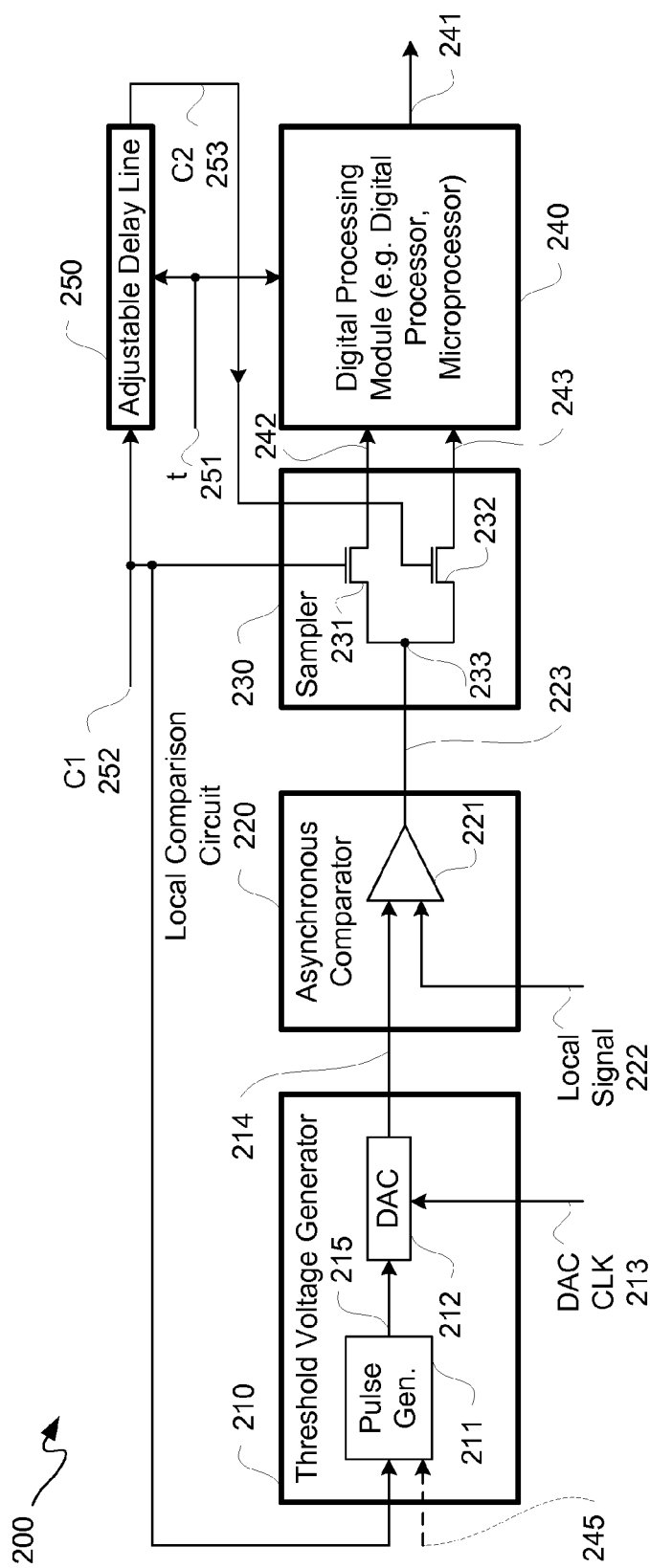
FIG. 2 is a block/circuit diagram depicting an exemplary on-chip noise measurement system.

FIG. 2 is a block/circuit diagram depicting an exemplary on-chip noise measurement system 200. Even though on-chip noise measurement system 200 is described in terms of measuring noise on one or more supply voltage lines, on-chip noise measurement system 200 may be used to measure noise on any signal line on a chip and/or provided to a chip. Furthermore, even though on-chip noise measurement system 200 is described in terms of implementing in an FPGA, such as FPGA 100 of FIG. 1 for example, any type IC may be used where on-chip noise measurement is to be performed.

The following description is for on-chip measurement of noise, and more particularly, random noise. It should be understood that noise is an analog phenomenon, namely an analog variation. However, transporting an analog signal over a long distance on a chip may cause significant degradation of such an analog signal when arriving at its destination. Furthermore, noise may be a very small signal, which makes it difficult to preserve. Therefore, it should be borne in mind in the following description that even though an analog measurement of noise is made by locally comparing a local signal of interest to a threshold voltage to measure noise of such local signal, a result of such measurement is a digital signal, which digital signal may be transported over a long distance on a chip with significantly less degradation than a comparable analog signal.

On-chip noise measurement system 200 includes a threshold voltage generator 210, a local comparison circuit 220, a sampler 230, a digital processing module 240, and an adjustable delay line 250. Local comparison circuit 220 may be located proximate to a signal of interest ("local signal") 222 for which noise thereon is to be measured. However, threshold voltage generator 210, sampler 230, digital processing module 240, and adjustable delay line 250, while all located on a same chip as local comparison circuit 220, may all be remotely located from local comparison circuit 220 on such chip. Of course, local comparison circuit 220 may be located proximate to one or more of threshold voltage generator 210, sampler 230, digital processing module 240, and adjustable delay line 250, but there may be multiple signals of interest on a chip for which measurement of noise may be useful.

Figure 3:
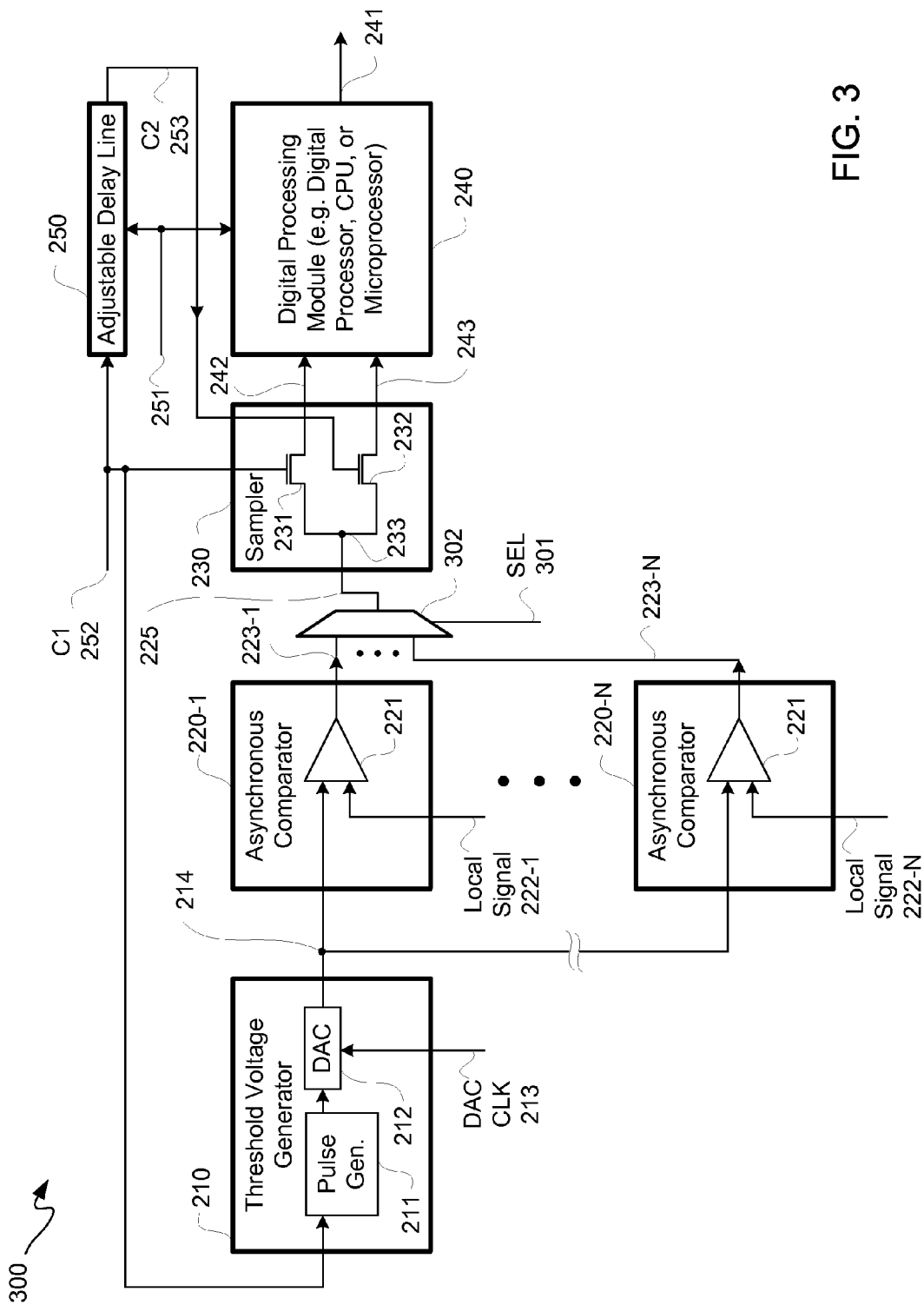
FIG. 3 is a block/circuit diagram depicting another exemplary on-chip noise measurement system.

Along those lines, FIG. 3 is a block/circuit diagram depicting an exemplary on-chip noise measurement system 300. On-chip noise measurement system 300 includes a threshold voltage generator 210, a plurality of local comparison circuits 220-1 through 220-N for N a positive integer greater than one, a sampler 230, a select circuit 302, a digital processing module 240, and an adjustable delay line 250. In this example, multiple local comparison circuits 220 may be distributed through a chip in which on-chip noise measurement system 300 resides. Each of such local comparison circuits 220-1 through 220-N may be located proximate to a corresponding local signal 222-1 through 222-N to be measured for noise. This approach allows a local signal 222 to be measured anywhere on a chip where a local comparison circuit 220 may be proximately positioned so as to enhance integrity of such measurement. Again, noise may be a very small signal, such as less than 100 millivolts, subject to significant degradation over distance traveled or routed on an IC, and thus by having a local signal 222 proximate to a local comparison circuit 220 for measurement of noise on such local signal 222, a more accurate indication of noise present on such local signal may be obtained. For purposes of clarity by way of example and not limitation, it shall be assumed that noise varies between 0 and 50 millivolts.

With the above description borne in mind, systems 200 and 300 are further described with simultaneous reference to FIGS. 2 and 3.

Each of local comparison circuits 220-1 through 220-N may include an asynchronous comparator 221, as described below in additional detail, to support such voltage range. For example, an asynchronous comparator 221 may be configured to: compare a local signal 222 to a threshold voltage 214; output a digital 1 on digital output signal ("digital output") 223 if such local signal 222 is greater than such threshold voltage 214; output a digital 0 on digital output 223 if such local signal 222 is less than such threshold voltage 214; and not change output of a prior state of digital output 223 if such local signal 222 is equal to such threshold voltage 214. By using a simple asynchronous comparator 221, the ability to locate a local comparison circuit 220 proximate to a local signal 222 of interest anywhere on a semiconductor die is enhanced. Such a digital output 223 may be a large signal relative to any measureable difference between a threshold voltage and a local signal 222, where noise on a local signal may cause amplitude of such local signal to be slightly above or below such threshold voltage. Additionally, speed of asynchronous comparator 221 to provide digital output 223 may be fast, which facilitates preservation of timing for an autocorrelation determination. Along those lines, threshold voltage 214 is not static, but, as described below in additional detail, such threshold voltage 214 is varied for purposes of an autocorrelation determination, as described below in additional detail.

Moreover, overhead and complexity is further reduced by having a single threshold voltage generator 210, a single sampler 230, a single select circuit 302, a single digital processing module 240, and a single adjustable delay line 250 to support multiple noise measurements associated with a plurality of local comparison circuits 220-1 through 220-N. Because a digital signal output from local comparison circuits 220 is substantially more robust than a corresponding analog signal output, output of such local comparison circuits 220 may be routed over long distances on a chip while maintaining sufficient signal integrity for producing accurate autocorrelations for noise. This facilitates having a single set of a threshold voltage generator 210, a sampler 230, a select circuit 302, a digital processing module 240, and an adjustable delay line 250 on a chip supporting multiple instances of noise measurements associated with a plurality of local comparison circuits 220 widely dispersed on such chip. Furthermore, by using a simple asynchronous comparator 221 locally positioned to a local signal 222 for a noise measurement, routing to and from such single set to such local comparison circuits 220 may be limited to a single threshold voltage signal 214, which may be provided to all such local comparison circuits 220, and associated digital outputs 223-1 through 223-N correspondingly output from local comparison circuits 220-1 through 220-N. In short, routing overhead may be significantly reduced in comparison to more complex autocorrelation approaches. Additionally, because there are no other signals having to be routed with as much care as digital outputs 223-1 through 223-N in order to preserve signal integrity, routing overhead is further reduced in comparison to approaches having multiple types of signals having to be routed with such care in avoiding interfering circuits in layout, shielding a route from interfering circuits, and/or other signal integrity maintaining technologies in routing. Along those lines, because digital outputs 223 are less sensitive with respect to amplitude, use of such signal integrity maintaining technologies in routing may be reduced Again, the following description is for measurement of random noise, or more particularly under the assumption that noise is a random or pseudo-random process even though supply noise for example may actually be deterministic. Along those lines, rather than finding exact behavior of noise, such noise is approached as a random or pseudo-random process measurable by its autocorrelation. Autocorrelation, or frequency spectrum, of noise may be used to determine effects of noise on circuits. Furthermore, shape of such frequency spectrum may provide information regarding source of such noise.

Autocorrelation (R) for a time-invariant or stationary random process may be mathematically defined as:

$$R(t)=E[V_{noise}+(/+t/2)v_{noise}(/-t/2)],$$

where E[ ] represents an energy value for such a random process, t represents a separation of two noise samples in time; $v_{noise}$ is a sampled voltage of noise; and / represents a period of such sample. Thus, for autocorrelation to be useful, samples taken are to be sufficiently close in time so as to have a correlation, namely t cannot be too large. Thus, noise in a signal is effectively correlated to itself, hence autocorrelation, by taking two samples relatively close in time. Furthermore, a Fourier transform of an autocorrelation result R(t) is a power spectral density ("PSD") of such a random process.

Local comparison circuit 220 may include an asynchronous comparator 221. By asynchronous comparator 221, it is generally meant that operation of such circuit is not a clocked operation. Asynchronous comparator 221 may be coupled to receive a first input signal, such as local signal 222 for example, and a second input signal, such as a comparator threshold voltage 214 for example, to provide a first digital output signal, such as digital output signal 223 for example. Digital output signal 223 includes frequency information for noise on local signal 222.

A threshold voltage generator 210 may be coupled to receive a first periodic signal, such as a first clock ("C1") signal 252 for example, to provide comparator threshold voltage 214 to local comparison circuit 220 as a clocked analog voltage. However, another type of periodic signal may be used as such first periodic signal to provide a stepped analog voltage.

In this example, threshold voltage generator 210 includes a pulse sequence generator 211 coupled in series with a digital-to-analog converter ("DAC") 212. Pulse sequence generator 211 may be coupled to receive C1 signal 252 to provide a second digital output signal, such as digital output signal 215 for example, as an input to DAC 212. Pulse sequence generator 211 may operate in an autocorrelation mode or a sub-sampling mode, as described below in additional detail. For an autocorrelation mode, output from pulse sequence generator 211 may be a changing pattern so no two consecutive DAC pulse inputs via digital output signal 215 are correlated. In other words, no two consecutive inputs to DAC 212 are the same. In a sub-sampling mode, pulse sequence generator 211 may be configured to provide a predetermined order of threshold voltages for output from DAC 212, where two consecutive inputs to DAC 212 may be the same.

DAC 212 may be coupled to receive digital output signal 215 from pulse sequence generator 211 and a DAC clock signal ("DAC clock") 213 to provide comparator threshold voltage 214 as an analog voltage. Comparator threshold voltage 214 may be provided as an input to asynchronous comparator 221, along with local signal 222, of local comparison circuit 220. Local comparison circuit 220 may be considered a sensor. Along those lines, a plurality of sensors 220 may be disposed about an IC die, such as FPGA 100 of FIG. 1 for example, where each such sensor 220 includes an asynchronous comparator 221. Along those lines, DAC 212 may be to provide comparator threshold voltage 214 as an analog voltage to each of such a plurality of sensors 220-1 through 220-N, such as an input to each asynchronous comparator 221 of such sensors 220, where each of such asynchronous comparators 221 likewise receives a corresponding local signal 222-1 through 222-N as an input.

A digital output 223 from asynchronous comparator 221 may be directly provided to a sampling circuit, such as sampler 230 for example. For a plurality of digital outputs 223-1 through 223-N, each of them may be provided as an input to a select circuit, such as a multiplexer 302 for example. Along those lines, multiplexer 302 may be coupled to receive a digital output 223 from each of sensors 220 and configured to select one of such digital outputs 223 from any of such plurality of sensors 220 for output 225 from multiplexer 302.

Output 225 from multiplexer 302 or digital output 223 directly from an asynchronous comparator 221, either of which is a digital signal, may be provided as an input to an input node 233 of sampler 230. Sampler 230 may include one or two samplers, such as pass gated transistors 231 and 232 for example. However, in other implementations, sampler 230 may be an integrator or other circuit configured to provide two samples. In this example, pass gated transistors 231 and 232 are NMOS transistors. Even though NMOS transistors 231 and 232 may be used, in another example PMOS transistors may be used. Furthermore, rather than pass gated transistor 231 and 232, an integrator may be used.

A source/drain node of each of transistors 231 and 232 are commonly coupled to input node 233. A gate of transistor 231 may be coupled to receive C1 signal 252, and a gate of transistor 232 may be coupled to receive another periodic signal, such as a clock ("C2") signal 253 for example. C2 signal 253 is related to the C1 signal 252. For example, a delay line, such as an adjustable delay line 250 for example, may be coupled to receive C1 signal 252 and a delay signal 251. Delay signal 251 may be to provide an amount of delay, t, between C1 signal 252 and C2 signal 253. In other words, C1 signal 252 may be delayed by an amount of delay, t, to provide C2 signal 253. Thus, C2 signal 253 may be C1 signal 252 delayed by an amount of delay, t. A tap of an adjustable delay line 250 may be selected responsive to delay signal 251 to provide such delay, t, to delay C1 signal 252, where such delay may be limited to granularity ($t_{step}$) of such adjustable delay line 250. An amount of delay, t, provided responsive to delay signal 251 may be associated with a highest frequency of noise to be detected, where such frequency is proportional to $1/t_{step}$.

Sampler 230 may be configured to sample a digital output 223 or 225 using C1 signal 252 to provide a sampling signal ("first sampling") 242 of digital output 223 or 225. Sampler 230 may further be configured to sample digital output 223 or 225 using C2 signal 253 to provide a sampling signal ("second sampling") 243 of digital output 223 or 225. A digital processing module ("processor") 240, such as a digital signal processor or a microprocessor or a central processing unit ("CPU") for example, may be coupled to receive a delay signal 251, first sampling 242 and second sampling 243 to determine a noise measurement signal 241 for an input signal, such as a local signal 222 or any of local signals 221-1 through 222-N. Noise measurement signal 241 may be for autocorrelation or sub-sampling, depending on mode of operation, as described above.

For an autocorrelation mode, pulse sequence generator 211 may be configured as a pseudo random binary sequence ("PRBS") generator. For an autocorrelation mode, pulse sequence generator 211 may be configured to provide an uncorrelated order of pulses to DAC 212 in order for DAC 212 to provide an uncorrelated order of threshold voltages as input to one or more asynchronous comparators 221. Such uncorrelated order of threshold voltages may be used by such one or more asynchronous comparators 221 to provide instances of digital output 223, or 223-1 through 223-N, for autocorrelation. For an autocorrelation mode, a decision threshold voltage input to an asynchronous comparator 221 may be a random signal with a magnitude greater than or equal to expected noise on a local signal 222 provided to such asynchronous comparator 221.

For a sub-sampling mode, pulse sequence generator 211 may be configured to provide a determined order of threshold voltages. For a sub-sampling mode, pulse sequence generator 211 may be configured to provide a correlated order of pulses to DAC 212, and thus DAC 212 may provide a correlated order of threshold voltages as input to one or more asynchronous comparators 221. Such correlated order of threshold voltages may be used by such one or more asynchronous comparators 221 to provide instances of digital output 223 or 223-1 through 223-N for sub-sampling.

Whether an uncorrelated order or a correlated order of digital output 223, or 223-1 through 223-N, analog voltages output from DAC 212 provide a stepped threshold voltage input to asynchronous comparator 221. Such a stepped threshold voltage may be a decision threshold voltage for an asynchronous comparator 221. Because pulse sequence generator 211 may generate pulses, whether correlated or uncorrelated, responsive to C1 signal 252, output from DAC 212 may be considered a clocked threshold voltage.

Processor 240 may be configured to ignore samples of first sampling 242 and second sampling 243 taken in a first interval of time responsive to a frequency of operation of DAC 212, namely a frequency of DAC clock 213. Such a first interval of time may be for 0 to T, where T may be a time period of DAC clock 213. Sampler 230 has two clock input signals, namely C1 signal 252 and C2 signal 253, neither of which has to be the same as DAC clock 213 which is provided as a periodic signal to threshold voltage generator 213. In this example, sampler 230 has two samplers, where one of such samplers samples with one periodic signal, namely sampler 231 coupled to receive C1 signal 252, and where another of such samplers samples with another periodic signal, namely sampler 232 coupled to receive C2 signal 253. Delay between C1 signal 252 and C2 signal 253 may determine a maximum noise frequency tone that may be detected for autocorrelation. In another example, a single sampler, such as either sampler 231 or 232 for example, may be used in sampler 230. A single sampler may be used in sampler 230, but use of a single sampler in sampler 230 might take twice the measurement time to achieve a same number of autocorrelation points as having two samplers in sampler 230. However, in sub-sampling, only one sampler, such as either sampler 231 or 232 for example, in sampler 230 may be used, as time delay between samples is not used in sub-sampling. In an embodiment for sub-sampling, for example, circuitry (not shown) may be used to disable one sampling path in sampler 230 for sub-sampling, or a single sampler may be used in sampler 231 for both autocorrelation and sub-sampling.

Using a single comparator for performing a measurement of a local signal saves die area, but samples of noise, such as taken in a time window from 0 to T seconds, may have a correlation error as such samples may be sampled by a same threshold. In other words, if a threshold voltage 214 is not changing at least as fast as autocorrelation samples are obtained, there exists a possibility of an autocorrelation error as a same threshold voltage 214 may be used for consecutive samples. To mitigate against such a correlation error for an autocorrelation mode, initial samples taken, such as taken in a time window from 0 to T seconds, may be ignored, where T is a period of a DAC clock 213. Additionally, this may allow a slower DAC 212 to be used or may allow operating DAC 212 at a lower frequency.

In another embodiment, pulse generator 211 need not receive C1 signal 252. Instead a separate clock signal 245 may optionally be provided to pulse generator 211 instead of C1 signal 252. Moreover, periodic signals provided to sampler 230 may be independent of periodic signals provided to threshold voltage generator 210. Along those lines, periodic signals respectively provided to pulse generator 211 and DAC 211 may be independent from one another, and such periodic signals respectively provided to pulse generator 211 and DAC 211 may be independent from either or both of the periodic signals provided to sampler 230. Such independence of periodic signals may be used in either or both an autocorrelation mode and a sub-sampling mode.

Figure 4:
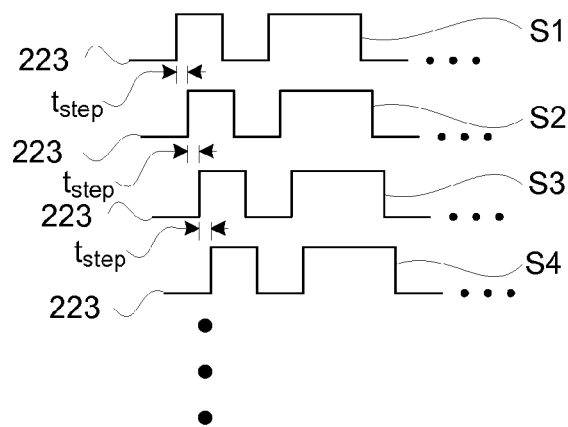
FIG. 4 is a signal diagram depicting an exemplary group of samples of a digital output, where each sample after a first sample is progressively delayed by an amount of delay.

FIG. 4 is a signal diagram depicting an exemplary group of samples S1 through S4 of a digital output 223, where each sample after a first sample S1 is progressively delayed by an amount of delay, $t_{step}$. A highest frequency noise component that may be sampled is $1/t_{step}$ Hz. Accordingly, sampling rate for autocorrelation for samples S1 through S4 may have to be a substantially large frequency (i.e., $1/t_{step}$) to avoid the above-mentioned potential for an autocorrelation error.

Figure 5:
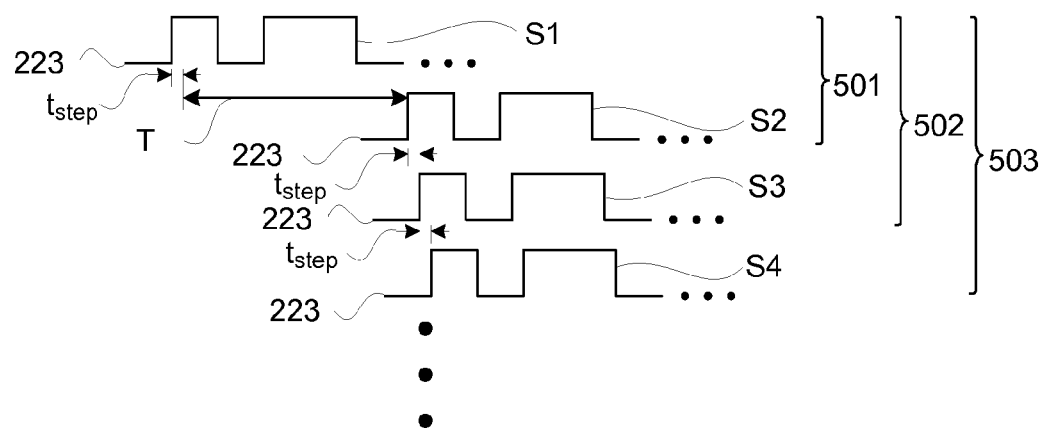
FIG. 5 is a signal diagram depicting the exemplary group of FIG. 4, except time or delay between a first sample and a second sample is increased by a period of time.

FIG. 5 is a signal diagram depicting the exemplary group of samples S1 through S4 of a digital output 223 of FIG. 4, except time or delay between a first sample S1 and a second sample S2 is $t_{step}$+T seconds. Along those lines, autocorrelation does not rely on two points from two different samples being delayed by $t_{step}$ seconds in order to obtain a highest frequency of noise component; rather, it is the relationship of such two points. Thus, by increasing delay between samples S1 and S2 for example from an amount of time $t_{step}$ to $t_{step}$+T, a time shifted relationship between a point on sample S1 and a point on sample S2 likewise yields a highest frequency noise component; however, frequency of operation of DAC 212 may be slowed down to 1/T, which is much slower than $1/t_{step}$, for autocorrelation at a much slower rate.

Autocorrelation 501 is between S1 and S2. After autocorrelation 501 may be autocorrelation 502, where autocorrelation 502 is between S1 and S3. After autocorrelation 502 may be autocorrelation 503, where autocorrelation 503 is between S1 and S4, and so on. Along those lines, two autocorrelation points may always be spaced by $T+nt_{step}$.

Figure 6:
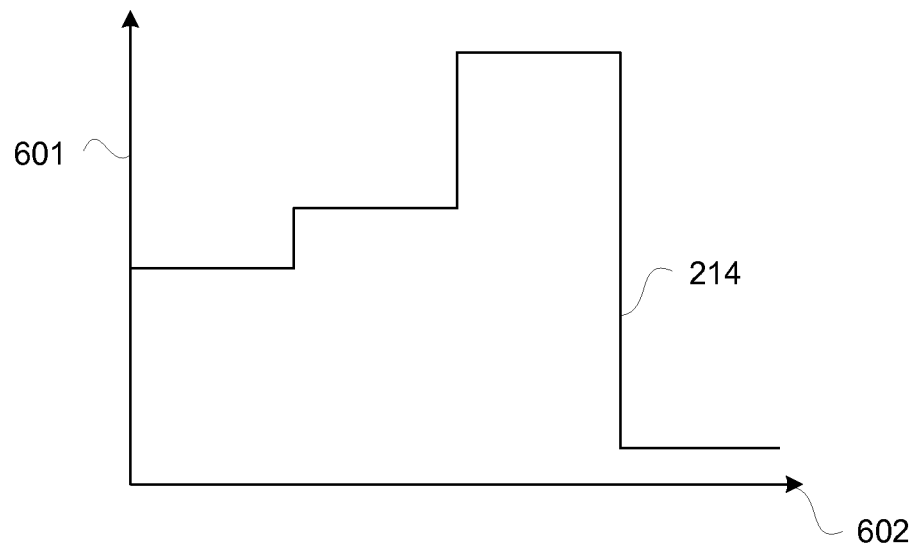
FIG. 6 is a signal diagram depicting an exemplary threshold voltage.
Figure 7:
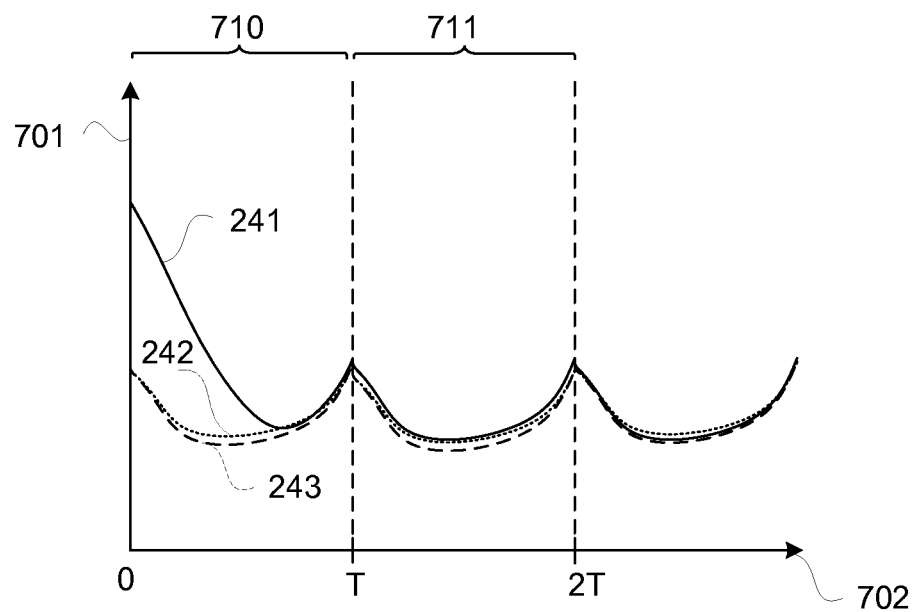
FIG. 7 is a signal diagram depicting an exemplary noise measurement signal.

FIG. 6 is a signal diagram depicting an exemplary threshold voltage 214 along a time axis 602 and a threshold voltage axis 601. FIG. 7 is a signal diagram depicting an exemplary noise measurement signal 241 for an autocorrelation mode along a time axis 702 and a noise voltage amplitude axis 701. With simultaneous reference to FIGS. 2 through 7, signal diagrams of FIGS. 6 and 7 are further described. For clarity, a common time axis 702 is used for noise measurement signal 241, as well as for sample signals 242 and 243; however, in other embodiments, signals 242 and 243 may not be represented on a common time axis 702 with noise measurement signal 241. Along those lines, signals 242 and 243 may not actually lead to an autocorrelation signal via a measurement signal 241; rather, FIG. 7 provides more of an approximation for purposes of clarity.

Using threshold voltage 214, first sampling or samples 242 and second sampling or samples 243 may be obtained in an interval 710 from 0 to T. However, an autocorrelation error may be in noise measurement signal 241. By ignoring samples 242 and 243 taken in interval 710, a second interval 711, which may immediately follow interval 710, from T to 2T may be used to obtain samples 242 and 243 in such interval 711 for providing noise measurement signal 241 for such interval 711 without an autocorrelation error. Again, T may be a period of a DAC clock 213.

Along the above lines, processor 240 may be configured to perform autocorrelation on first sampling 242 and second sampling 243 for a second interval 711 of time after a first interval 710 of time in order to determine a noise measurement signal 241 for autocorrelation of an input signal 222.

Figure 8:
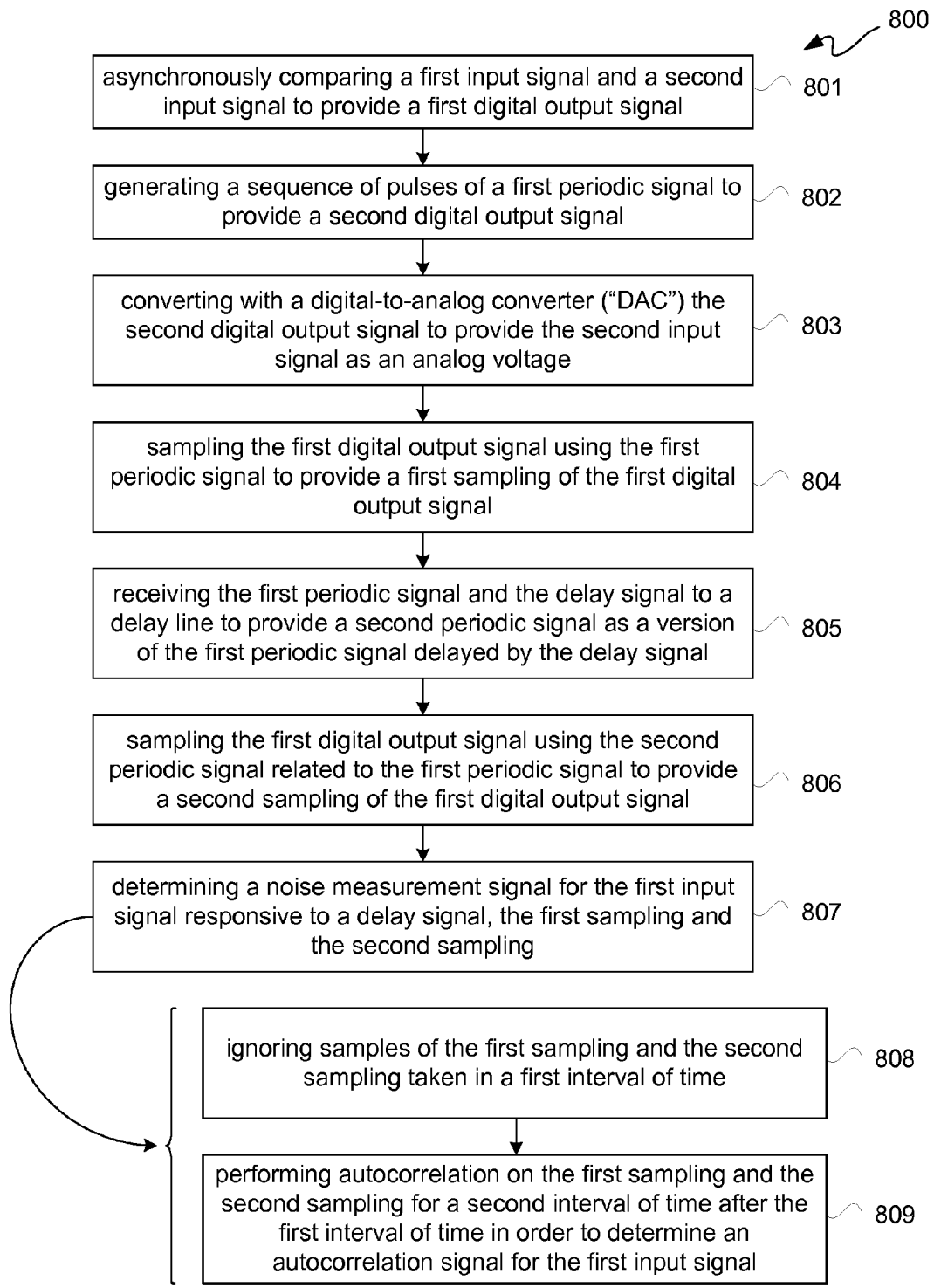
FIG. 8 is a flow diagram depicting an exemplary noise measurement flow.

FIG. 8 is a flow diagram depicting an exemplary noise measurement flow 800. Noise measurement flow 800 is further described with additional reference to FIGS. 2 through 7. At 801, a first input signal 222 and a second input signal 214 may be asynchronously compared to provide a first digital output signal 223. First digital output signal 223 includes frequency information for noise on first input signal 222.

At 802, a sequence of pulses may be generated responsive to a first periodic signal, namely C1 signal 252, to provide a second digital output signal 215. At 803, DAC 212 may convert second digital output signal 215 to provide second input signal 214 as an analog voltage. Such analog voltage may provide a clocked threshold voltage. At 804, first digital output signal 223 may be sampled using such first periodic signal to provide a first sampling 242 of first digital output signal 223.

At 805, C1 signal 252 and a delay signal 251 may be provided to a delay line 250 to provide a second periodic signal, namely C2 signal 253, as a version of C1 signal 252 delayed by delay signal 251. At 806, first digital output signal 223 may be sampled using C2 signal 253 related to C1 signal 252 to provide a second sampling 243 of first digital output signal 223.

At 807, a noise measurement signal 241 may be determined for first input signal 223 responsive to delay signal 251, first sampling 242 and second sampling 243. At 808, processor 240 may ignore samples of first sampling 242 and second sampling 243 taken in a first interval of time, such as interval 710 for example. At 809, processor 240 may perform autocorrelation on samples from first sampling 242 and second sampling 243 taken in a second interval of time, such as interval 711 for example, sometime after first interval of time 710 in order to determine an autocorrelation signal 241 for first input signal 223.

Various circuit implementation styles may be used to implement asynchronous comparator 221 or any of the other blocks in the above-described on-chip noise measurement system in accordance with the above description. Along those lines, circuit styles employed in the above-description are provided for purposes of clarity by way of example and not limitation.

As described above, using only a single asynchronous comparator as a sensor, autocorrelation of noise on a signal may be measured. Thus, routing of a sampling clock locally may be avoided. By avoiding routing and by providing a single set of infrastructure circuits to support multiple sensors, a noise measurement system may be provided which is area efficient and non-invasive to the nearby circuits close to a local signal of interest. Furthermore, autocorrelation of high frequency noise content may be obtained without any correlation error while employing a low speed DAC to generate comparison thresholds. As previously described, by eliminating an erroneous portion of data, processing of subsequent autocorrelation data may be used to obtain a result without any autocorrelation error.

The above-described on-chip noise measurement and signal characterization system may be used to measure DC level, low frequency noise content, and/or high frequency noise content of many signals of interest in an FPGA, an ASIC, or a microprocessor chip, or other type of IC. By using a single asynchronous comparator as a sensor, in addition to avoiding routing clocks to sensors, only a single threshold signal may be routed to one or more sensors, and further each such sensor produces a single digital output for routing. Thus, local clock calibration with respect to a sensor may be eliminated. This promotes a highly area efficient and measurement repeatable noise measurement system, which may be used on many signal lines across a chip. Noise characterization may be performed by determining autocorrelation of noise on a target signal line, such as a DC bias, a supply voltage, or a common ground, or other signal line for example, to obtain information for determining Power Spectral Density ("PSD") of noise.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
an asynchronous comparator coupled to receive a first input signal and a second input signal to provide a first digital output signal;
wherein the first digital output signal includes frequency information for noise on the first input signal;
a threshold voltage generator coupled to receive a first periodic signal and a second periodic signal;
wherein the threshold voltage generator is configured to provide the second input signal as an analog voltage responsive to the first periodic signal;
a sampling circuit coupled to receive the first digital output signal, a third periodic signal, and a fourth periodic signal;
wherein the fourth periodic signal is related to the third periodic signal;
wherein the sampling circuit is configured to sample the first digital output signal using the third periodic signal to provide a first sampling of the first digital output signal and configured to sample the first digital output signal using the fourth periodic signal to provide a second sampling of the first digital output signal; and
a processor coupled to receive a delay signal, the first sampling, and the second sampling to determine a noise measurement signal for the first input signal.

2. The apparatus according to claim 1, further comprising:
a delay line coupled to receive the third periodic signal and the delay signal to provide the fourth periodic signal;
wherein the threshold voltage generator includes a pulse sequence generator and a digital-to-analog converter ("DAC");
wherein the pulse sequence generator is coupled to receive the first periodic signal to provide a second digital output signal;
wherein the DAC is coupled to receive the second periodic signal and the second digital output signal to provide the second input signal as the analog voltage; and wherein the fourth periodic signal is a version of the third periodic signal delayed by a delay associated with the delay signal.

3. The apparatus according to claim 2, wherein the processor is selected from a group consisting of a central processing unit and a digital signal processor.

4. The apparatus according to claim 2, wherein the noise measurement signal is an autocorrelation signal.

5. The apparatus according to claim 2, wherein the pulse sequence generator is a pseudo random binary sequence ("PRBS") generator configured to provide an uncorrelated order of threshold voltages to provide instances of the second digital output signal.

6. The apparatus according to claim 2, wherein the pulse sequence generator is configured to provide a determined order of threshold voltages to provide instances of the second digital output signal.

7. The apparatus according to claim 2, wherein the analog voltage provides a stepped threshold voltage.

8. The apparatus according to claim 7, wherein:
the stepped threshold voltage is a decision threshold voltage for the asynchronous comparator and is a clocked threshold voltage; and
the decision threshold voltage is a random signal with magnitude greater than or equal to expected noise on the first input signal.

9. The apparatus according to claim 2, wherein the processor is configured to ignore samples of the first sampling and the second sampling taken in a first interval of time responsive to a frequency of operation of the DAC associated with the second periodic signal.

10. The apparatus according to claim 9, wherein the processor is further configured to perform autocorrelation on the first sampling and the second sampling for a second interval of time after the first interval of time in order to determine the autocorrelation signal for the first input signal.

11. The apparatus according to claim 10, wherein:
the first interval of time is from 0 to T seconds for T a period of a DAC clock provided as the second periodic signal and used to clock the DAC; and
the first periodic signal and the third periodic signal are the same signal.

12. The apparatus according to claim 1, further comprising:
a plurality of asynchronous comparators including the asynchronous comparator;
wherein each of the plurality of asynchronous comparators is respectively coupled to receive a plurality of first input signals including the first input signal and the second input signal to provide a plurality of first digital output signals including the first digital output signal;
wherein the plurality of first digital output signals respectively includes frequency information for noise on the plurality of first input signals;
wherein the second input signal is provided as an analog voltage to each of the plurality of sensors;
a select circuit coupled to receive the plurality of first digital output signals configured to select the first digital output signal from any of the plurality of first digital output signals for output from the select circuit;
wherein the sampling circuit is coupled to receive the first digital output signal output from the select circuit; and
wherein the processor is configured to provide the noise measurement signal for the first input signal selected.

13. An apparatus, comprising:
an asynchronous comparator coupled to receive a first input signal and a second input signal to provide a first digital output signal;
wherein the first digital output signal includes frequency information for noise on the first input signal;
a threshold voltage generator coupled to receive a first periodic signal and a second periodic signal;
wherein the threshold voltage generator is configured to provide the second input signal as an analog voltage responsive to the first periodic signal and the second periodic signal;
a sampling circuit coupled to receive the first digital output signal and a third periodic signal;
wherein the sampling circuit is configured to sample the first digital output signal using the third periodic signal to provide a sampled signal of the first digital output signal; and
a processor coupled to receive a delay signal and the sampled signal to determine a noise measurement signal for the first input signal.

14. The apparatus according to claim 13, wherein:
the threshold voltage generator includes a pulse sequence generator and a digital-to-analog converter ("DAC");
the pulse sequence generator is coupled to receive the first periodic signal to provide a second digital output signal; and
the DAC is coupled to receive the second periodic signal and the second digital output signal to provide the second input signal as the analog voltage.

15. The apparatus according to claim 14, wherein the processor is selected from a group consisting of a central processing unit and a digital signal processor.

16. The apparatus according to claim 14, wherein the pulse sequence generator is a pseudo random binary sequence ("PRBS") generator configured to provide an uncorrelated order of threshold voltages to provide instances of the second digital output signal.

17. The apparatus according to claim 14, wherein the pulse sequence generator is configured to provide a determined order of threshold voltages to provide instances of the second digital output signal.

18. The apparatus according to claim 14, wherein:
the analog voltage provides a stepped threshold voltage;
the stepped threshold voltage is a decision threshold voltage for the asynchronous comparator and is a clocked threshold voltage;
the first periodic signal and the third periodic signal are the same signal; and
the decision threshold voltage is a random signal with magnitude greater than or equal to expected noise on the first input signal.

19. A method, comprising:
asynchronously comparing a first input signal and a second input signal with an asynchronous comparator to provide a first digital output signal;
wherein the first digital output signal includes frequency information for noise on the first input signal;
generating a sequence of pulses responsive to a first periodic signal to provide a second digital output signal;
converting, with a digital-to-analog converter ("DAC") coupled to receive a second periodic signal, the second digital output signal to provide the second input signal as an analog voltage;
sampling the first digital output signal using a third periodic signal to provide a first sampling of the first digital output signal;

sampling the first digital output signal using a fourth periodic signal related to the third periodic signal to provide a second sampling of the first digital output signal; and determining a noise measurement signal for the first input signal responsive to a delay signal, the first sampling, and the second sampling.

20. The apparatus according to claim 18, wherein the determining comprises:

ignoring samples of the first sampling and the second sampling taken in a first interval of time; and performing autocorrelation on the first sampling and the second sampling for a second interval of time after the first interval of time in order to determine an autocorrelation signal for the first input signal.

* * * * *